(12) United States Patent
Koizumi et al.

(10) Patent No.: US 9,720,333 B2
(45) Date of Patent: Aug. 1, 2017

(54) EXPOSURE APPARATUS AND METHOD OF MANUFACTURING ARTICLE

(71) Applicant: CANON KABUSHIKI KAISHA, Tokyo (JP)

(72) Inventors: Ryo Koizumi, Utsunomiya (JP); Daisuke Kobayashi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 141 days.

(21) Appl. No.: 14/736,423

(22) Filed: Jun. 11, 2015

(65) Prior Publication Data
US 2015/0362845 A1 Dec. 17, 2015

(30) Foreign Application Priority Data
Jun. 12, 2014 (JP) .................................. 2014-121850

(51) Int. Cl.
G03B 27/58 (2006.01)
G03F 7/20 (2006.01)

(52) U.S. Cl.
CPC .............................. *G03F 7/70725* (2013.01)

(58) Field of Classification Search
CPC ......................... G03F 7/70941; G03F 7/70725
USPC ........................................................ 355/72
See application file for complete search history.

(56) References Cited

U.S. PATENT DOCUMENTS

| 6,778,285 B1* | 8/2004 | Nguyen | G01B 11/0616 356/630 |
| 2003/0020893 A1* | 1/2003 | Kawashima | G03F 7/70066 355/67 |
| 2006/0176461 A1* | 8/2006 | Sekine | G03F 7/70341 355/67 |
| 2008/0259307 A1* | 10/2008 | Arai | G03B 27/54 355/71 |

FOREIGN PATENT DOCUMENTS

JP 2008222222 A 9/2008

* cited by examiner

*Primary Examiner* — Peter B Kim
(74) *Attorney, Agent, or Firm* — Rossi, Kimms & McDowell LLP

(57) ABSTRACT

The present invention provides a scan-type exposure apparatus comprising an aperture stop provided with at least one of a mask stage and a substrate stage and configured to reduce an influence of flare light, wherein an opening of the aperture stop includes a first opening portion corresponding to one shot region on a substrate, and a serrated second opening portion including a plurality of first openings that protrude in a second direction parallel to the scanning direction from a side of the first opening portion along a first direction perpendicular to the scanning direction, and a length of each of the plurality of first openings in the first direction decreases outward in the second direction from the side of the first opening portion along the first direction.

10 Claims, 7 Drawing Sheets

F I G. 4
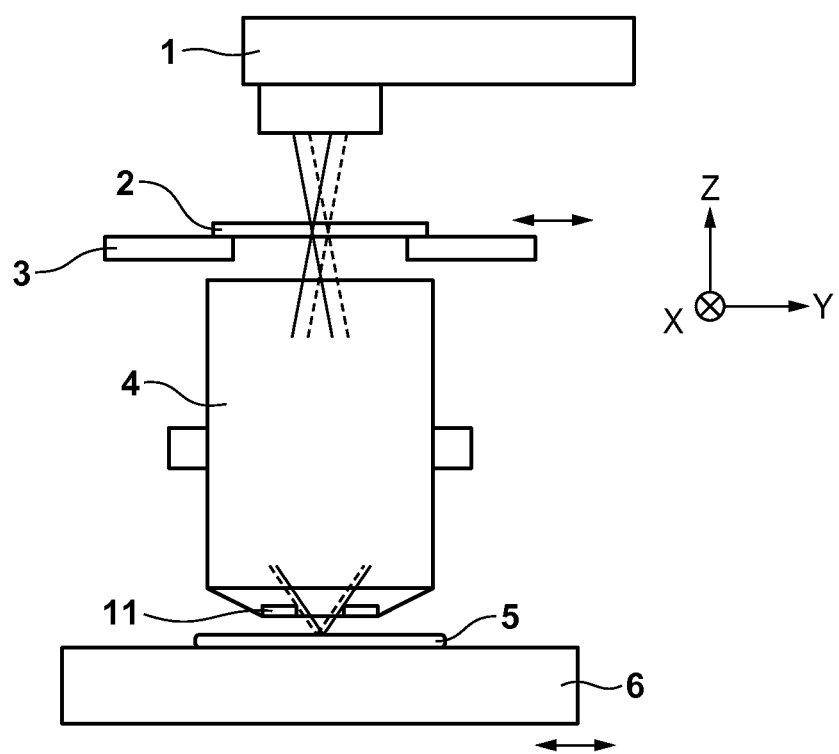

FIG. 5A
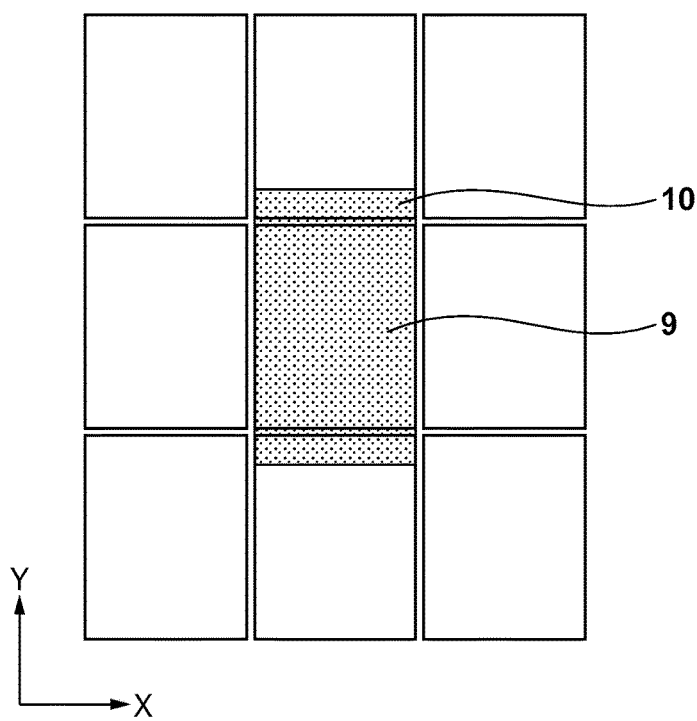
FIG. 5C
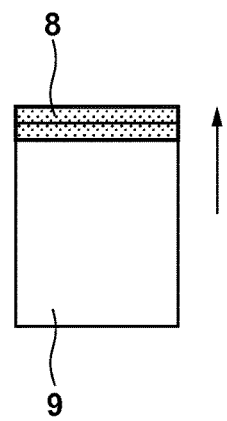
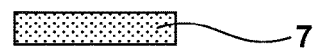
FIG. 5B

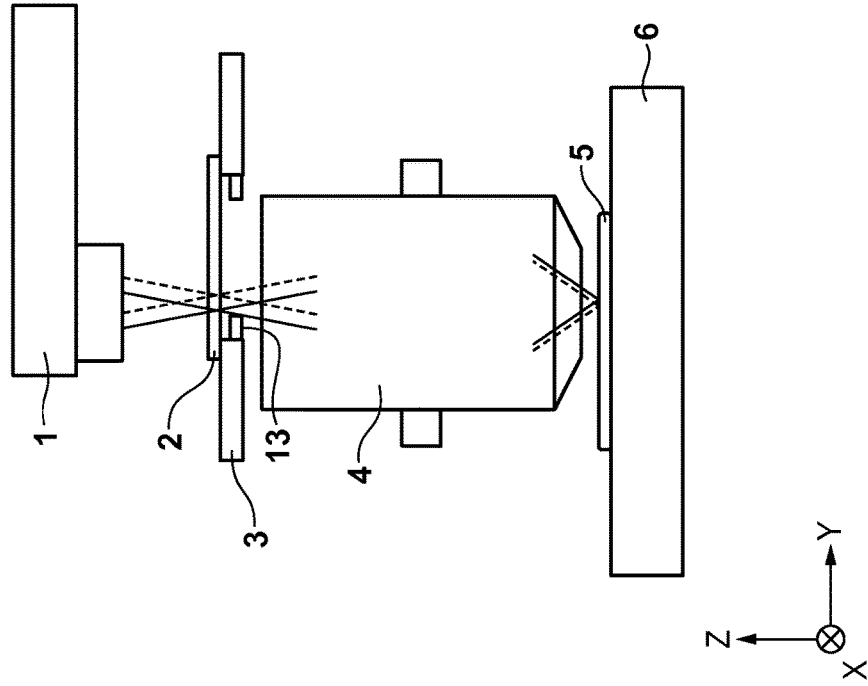
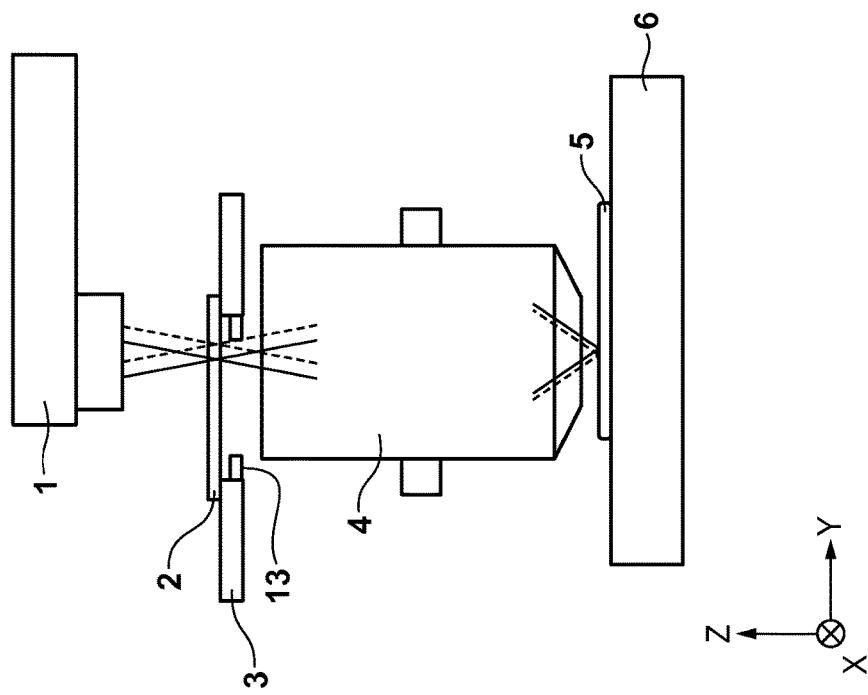

EXPOSURE APPARATUS AND METHOD OF MANUFACTURING ARTICLE

BACKGROUND OF THE INVENTION

Field of the Invention

The present invention relates to an exposure apparatus and a method of manufacturing an article.

Description of the Related Art

When manufacturing a semiconductor device using photolithography, an exposure apparatus that projects the pattern of a mask (reticle) to a substrate by a projection optical system and transfers the pattern is used. The recent mainstream is a scan-type exposure apparatus (scanner) that continuously transfers the pattern of a mask to a substrate while synchronously scanning the mask and the substrate.

In the exposure apparatus, out of light passed (transmitted) through the mask, light reflected by an optical element in the projection optical system and then reflected by the mask again is called flare light (projection system flare light). In the scan-type exposure apparatus, if flare light reaches a region other than an exposure region on the substrate, a light amount distribution is formed in adjacent shot regions (in the scanning direction or a direction perpendicular to the scanning direction) to deteriorate the imaging characteristic. Japanese Patent Laid-Open No. 2008-222222 proposes an exposure apparatus including a projection optical system provided with an aperture stop configured to block flare light.

In the scan-type exposure apparatus, if the aperture stop is provided with the projection optical system as in the related art, flare light that reaches adjacent shot regions adjacent in the direction perpendicular to the scanning direction can be blocked. However, since the exposure slit has a width in the scanning direction, flare light that reaches shot regions adjacent in scanning direction cannot completely be blocked. Hence, in the scan-type exposure apparatus, it is impossible to sufficiently suppress, by the prior art, deterioration of the imaging characteristic cased by flare light.

SUMMARY OF THE INVENTION

The present invention provides an exposure apparatus advantageous in reducing the influence of flare light that enters from a projection optical system to a substrate.

According to one aspect of the present invention, there is provided a scan-type exposure apparatus for transferring a pattern of a mask to a substrate via a projection optical system while scanning the mask and the substrate in a scanning direction, including an aperture stop provided with at least one of a mask stage that holds the mask and is movable and a substrate stage that holds the substrate and is movable and configured to reduce an influence of flare light that enters from the projection optical system to the substrate, wherein an opening of the aperture stop includes a first opening portion corresponding to one shot region on the substrate, and a serrated second opening portion including a plurality of first openings that protrude in a second direction parallel to the scanning direction from a side of the first opening portion along a first direction perpendicular to the scanning direction, and a length of each of the plurality of first openings in the first direction decreases outward in the second direction from the side of the first opening portion along the first direction.

Further aspects of the present invention will become apparent from the following description of exemplary embodiments with reference to the attached drawings.

BRIEF DESCRIPTION OF THE DRAWINGS

FIG. 4 is a schematic view showing the arrangement of an exposure apparatus.

FIGS. 5A to 5C are views for explaining the influence of flare light.

FIGS. 6A and 6B are schematic views showing the arrangement of the exposure apparatus.

DESCRIPTION OF THE EMBODIMENTS

Figure 1:
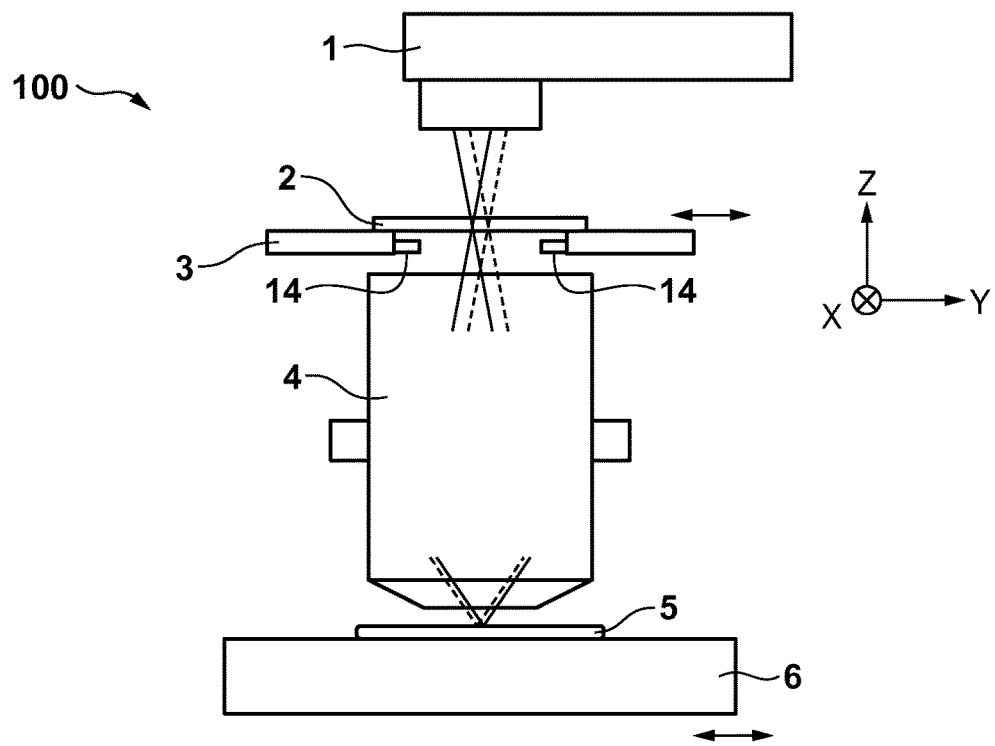
FIG. 1 is a schematic view showing the arrangement of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 100 according to an aspect of the present invention. The exposure apparatus 100 is a scan-type exposure apparatus (scanner) that transfers the pattern of a mask to a substrate via a projection optical system while scanning the mask and the substrate in the scanning direction (direction of the arrows in FIG. 1). The exposure apparatus 100 includes an illumination optical system 1, a mask stage 3 that holds a mask 2 and is movable, a projection optical system 4, a substrate stage 6 that holds a substrate 5 and is movable, and an aperture stop 14.

Light emitted from the illumination optical system 1 and shaped into a rectangle (rectangular exposure slit) passes through the mask 2 held on the mask stage 3 and enters the projection optical system 4. A pattern to be transferred to the substrate 5 is drawn in the mask 2. Since the mask 2 and the substrate 5 hold an optically conjugate positional relationship, the pattern of the mask 2 is transferred to the substrate 5 held on the substrate stage 6 via the projection optical system 4. In this embodiment, the substrate 5 is exposed while synchronously scanning the mask stage 3 (mask 2) and the substrate stage 6 (substrate 5) in the Y-axis direction (scanning direction).

Figure 2:
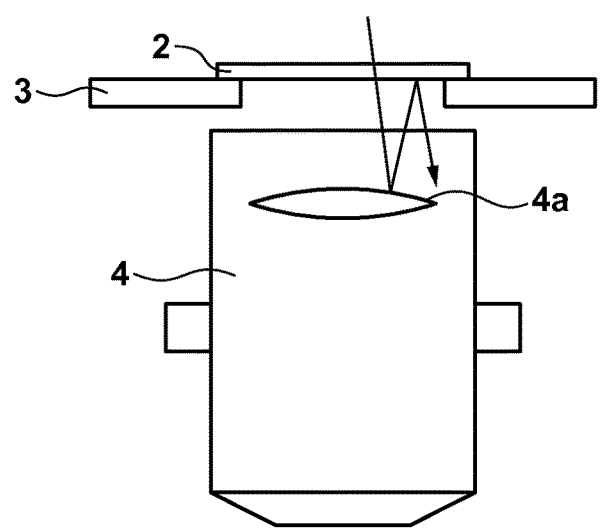
FIG. 2 is a view for explaining flare light.

FIG. 2 is a view for explaining flare light (projection system flare light) generated in the projection optical system 4. Referring to FIG. 2, part of light passed through the mask 2 is reflected by an optical element 4a included in the projection optical system 4 to the mask side and further reflected by the mask 2. The light then enters the projection optical system 4 and becomes flare light.

Figure 3A:
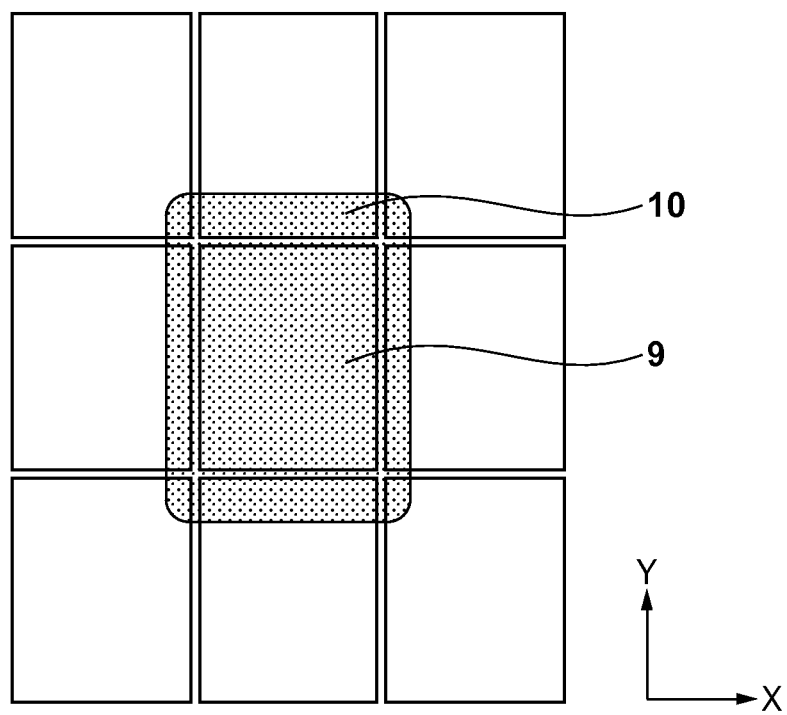
FIGS. 3A and 3B are views for explaining the influence of flare light.
Figure 3B:
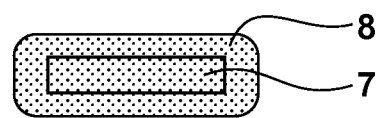

The influence of flare light in a case where it reaches a shot region other than a normal exposure region (target shot region to transfer the pattern of the mask 2) on the substrate will be described with reference to FIGS. 3A and 3B. The substrate 5 is exposed while synchronously scanning the mask stage 3 and the substrate stage 6 with respect to the light emitted from the illumination optical system 1 and shaped into a rectangle, that is, an exposure slit 7, thereby forming a normal exposure region 9. The exposure region 9 is repetitively formed while sequentially moving stepwise in the X- and Y-axis directions, thereby forming a plurality of exposure regions (shot regions) on the substrate. If the flare light reaches the substrate 5, a light amount distribution 8 spreading off the exposure slit 7 is formed, as shown in FIG. 3B. Hence, when one shot region on the substrate 5 is exposed while synchronously scanning the mask stage 3 and the substrate stage 6, a light amount distribution 10 spreading off the shot region is consequently formed (the region off the shot region is also exposed). A light amount distribution is thus formed in shot regions adjacent to the normal exposure region 9 in the X- and Y-axis directions, resulting in deterioration of the imaging characteristic.

The technique disclosed in Japanese Patent Laid-Open No. 2008-222222, that is, an exposure apparatus whose projection optical system 4 includes an aperture stop 11 configured to block flare light, as shown in FIG. 4, will be examined. In this exposure apparatus, light (flare light) spreading off the exposure slit 7 does not exist, as shown in FIG. 5B. However, since the exposure slit 7 has a width in Y-axis direction, the light amount distribution 8 spreading off the exposure slit 7 is formed, as shown in FIG. 5C. Hence, when the substrate 5 is exposed while synchronously scanning the mask stage 3 and the substrate stage 6, a light amount distribution 12 as shown in FIG. 5A is formed on the substrate. As described above, even if the aperture stop 11 is provided with the projection optical system 4, it is impossible to completely suppress the influence of flare light on the shot regions adjacent to the normal exposure region 9 in the Y-axis direction (scanning direction).

To suppress the influence of flare light on the shot regions adjacent to the normal exposure region 9 in the Y-axis direction (scanning direction), an aperture stop 13 may be provided with the mask stage 3, as shown in FIGS. 6A and 6B. Each of FIGS. 6A and 6B shows a state in which the mask stage 3 and the substrate stage 6 are synchronously scanned in the ±Y-axis direction to expose the normal exposure region 9. The aperture stop 13 has an opening shape that does not block normal exposure light in the maximum region in the ±Y-axis direction. The aperture stop 13 moves together with the mask stage 3 and is therefore not influenced by the width of the exposure slit 7 in the Y-axis direction. The aperture stop 13 is provided at a position spaced apart from the mask 2 in the Z-axis direction because of the restriction of arrangement space. In this case, since the position of the aperture stop 13 is defocused from the mask 2, as shown in FIGS. 6A and 6B, light that spreads through the mask 2 is blocked by the aperture stop 13. As a result, the light that reaches the substrate 5 reaches the shot regions adjacent to the normal exposure region 9 in the Y-axis direction. The flare light cannot completely be blocked. In addition, a light amount distribution that abruptly changes the light amount in the adjacent shot regions is formed.

Figure 7:
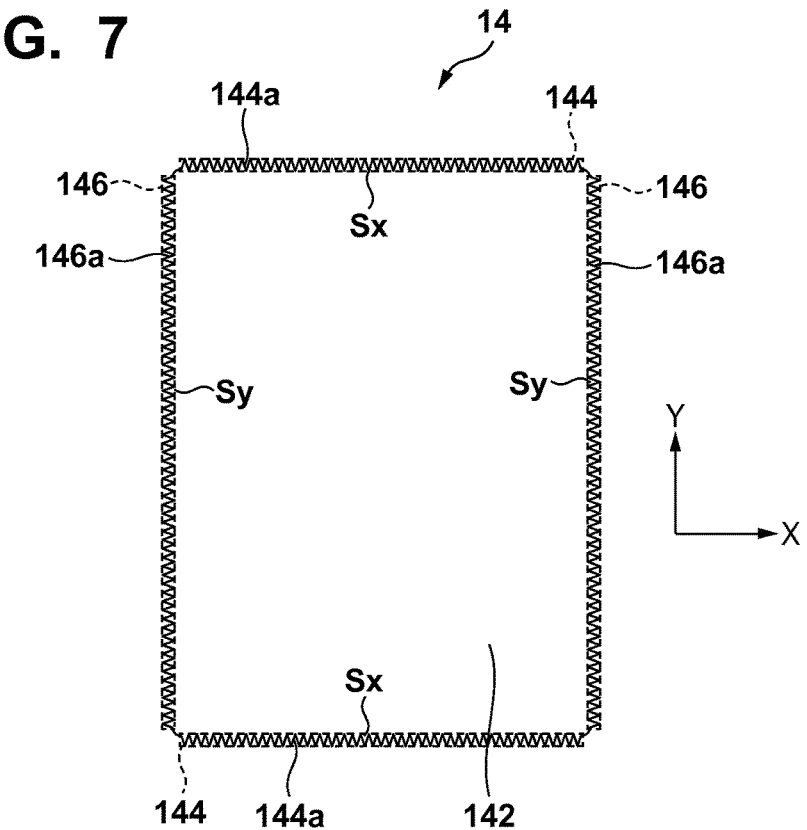
FIG. 7 is a view showing an example of the shape of an opening of an aperture stop provided with the exposure apparatus shown in FIG. 1.

In this embodiment, the aperture stop 14 as shown in FIG. 7 is provided with the mask stage 3. The aperture stop 14 has an opening to reduce the influence of flare light that enters from the projection optical system 4 to the substrate 5. The opening of the aperture stop 14 includes a first opening portion 142 corresponding to one shot region on the substrate, and a second opening portion 144. The second opening portion 144 is a serrated opening portion including a plurality of first openings 144a that protrude outward in the second direction (Y-axis direction) parallel to the scanning direction from sides Sx of the first opening portion 142 along the first direction (X-axis direction) perpendicular to the scanning direction. The length of each of the plurality of first openings 144a in the X-axis direction decreases outward in the Y-axis direction from the side Sx of the first opening portion 142 along the X-axis direction (that is, the length changes in accordance with the distance in the Y-axis direction).

The opening of the aperture stop 14 also includes a serrated third opening portion 146 including a plurality of second openings 146a that protrude in the X-axis direction from sides of the first opening portion 142 along the Y-axis direction. The length of each of the plurality of second openings 146a in the Y-axis direction decreases outward in the X-axis direction from a side Sy of the first opening portion 142 along the Y-axis direction. However, the third opening portion 146 is not always necessary from the viewpoint of reducing the influence of flare light that reaches the shot regions adjacent to the normal exposure region 9 in the Y-axis direction.

Figure 8:
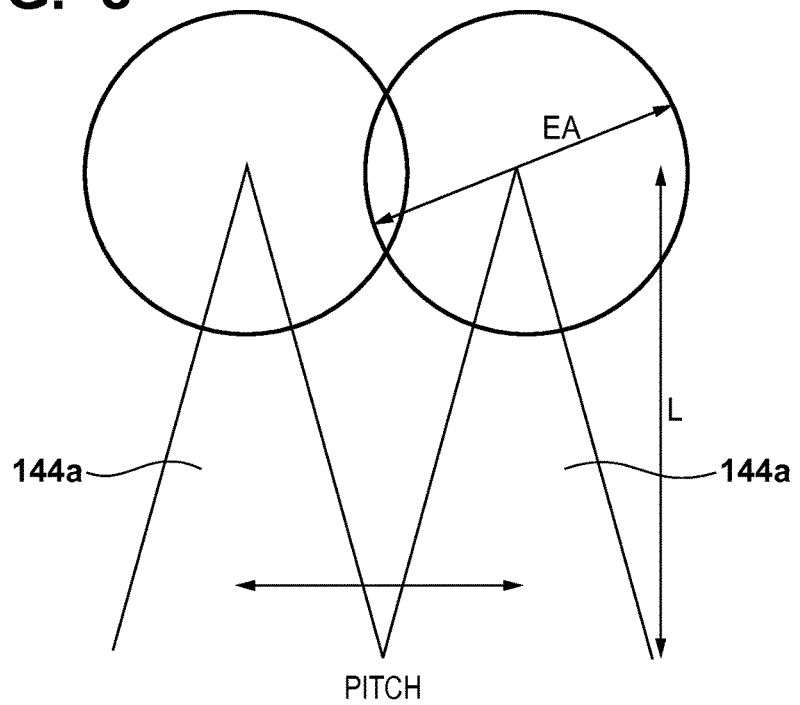
FIG. 8 is an enlarged view of the first openings of the second opening portion of the aperture stop shown in FIG. 7.

FIG. 8 is an enlarged view of part of an end of the aperture stop 14 in the Y-axis direction, more specifically, the first openings 144a of the second opening portion 144. FIG. 8 also illustrates a diameter EA of a light beam, which enters the aperture stop 14, on the aperture plane (that is, the diameter of a defocused light beam). Since the aperture stop 14 is arranged at a position defocused from the mask 2, the light beam entering the aperture stop 14 spreads. Hence, the shape of the opening of the aperture stop 14, particularly, the serrated second opening portion 144 is not directly transferred to the substrate 5. Instead, it is transferred to the substrate 5 as a spatially blurred shape.

The larger the diameter EA of the light beam, which enters the aperture stop 14, on the aperture plane becomes with respect to the X-axis direction pitch of the first openings 144a of the second opening portion 144, the more blurred the shape of the second opening portion 144 transferred to the substrate 5 is. Hence, in this embodiment, the second opening portion 144 is formed such that the pitch of the plurality of first openings 144a in the X-axis direction becomes smaller than the diameter EA of the light beam, which enters the aperture stop 14, on the aperture plane.

Let Z be the distance from the object plane of the projection optical system 4 to the aperture stop 14, NA be the numerical aperture on the object plane side of the projection optical system 4, and EA be the diameter of the light beam, which enters the aperture stop 14, on the aperture plane. In this embodiment, they meet $$EA = NA \times Z \times 2 \tag{1}$$

Meeting this condition makes it possible to improve the effect of transferring the serrated second opening portion 144 to the substrate 5 as a spatially blurred shape.

Figure 9:
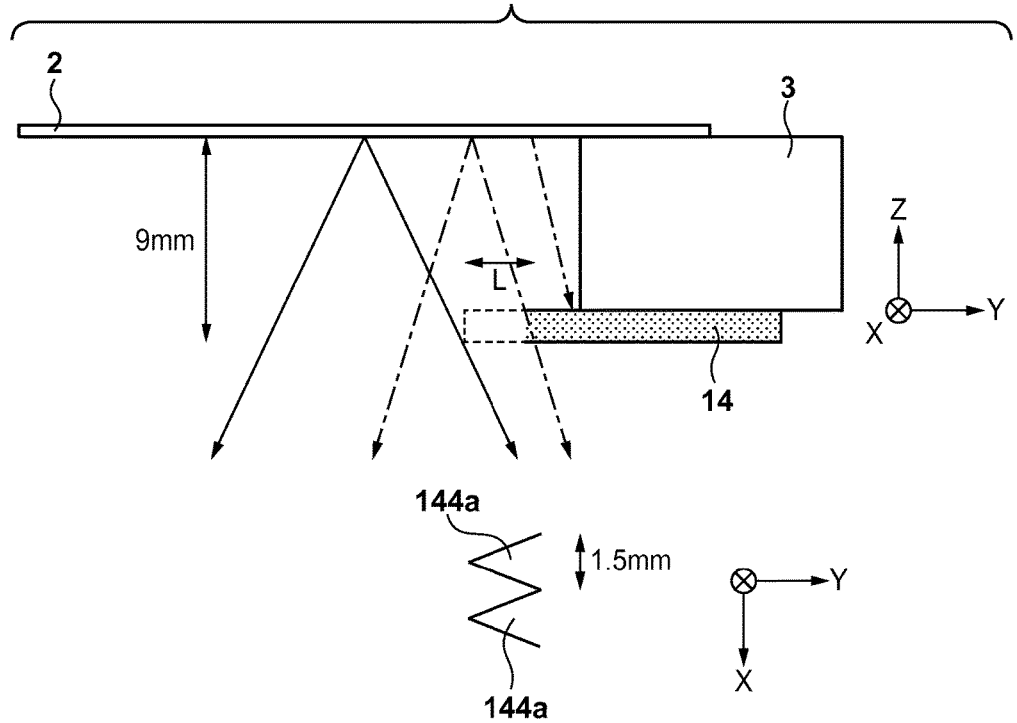
FIG. 9 is a view showing the vicinity of an aperture stop provided with the mask stage of the exposure apparatus shown in FIG. 1.

An effect obtained by providing the aperture stop 14 as shown in FIG. 7 with the mask stage 3 will be described. As shown in FIG. 9, the aperture stop 14 is arranged at a position defocused (spaced apart) from the mask 2 by 9 mm in the Z-axis direction, and has an opening that does not block normal exposure light indicated by the solid lines. Consider three opening shapes (type 1, type 2, and type 3) as the shape of the opening of the aperture stop 14. Type 1 and type 2 are serrated opening shapes as shown in FIG. 7, and the pitch of the first openings 144a in the X-axis direction is set to 1.5 mm. A length L of the first openings 144a in the Y-axis direction is 4 mm in type 1 and 7 mm in type 2. On the other hand, type 3 is a simple rectangular opening shape, that is, the opening shape of the aperture stop 13. The numerical aperture on the object plane side of the projection optical system 4 is 0.092. In this case, the diameter EA of the light beam on the aperture plane is 0.092×2×9=1.66 mm.

Figure 10:
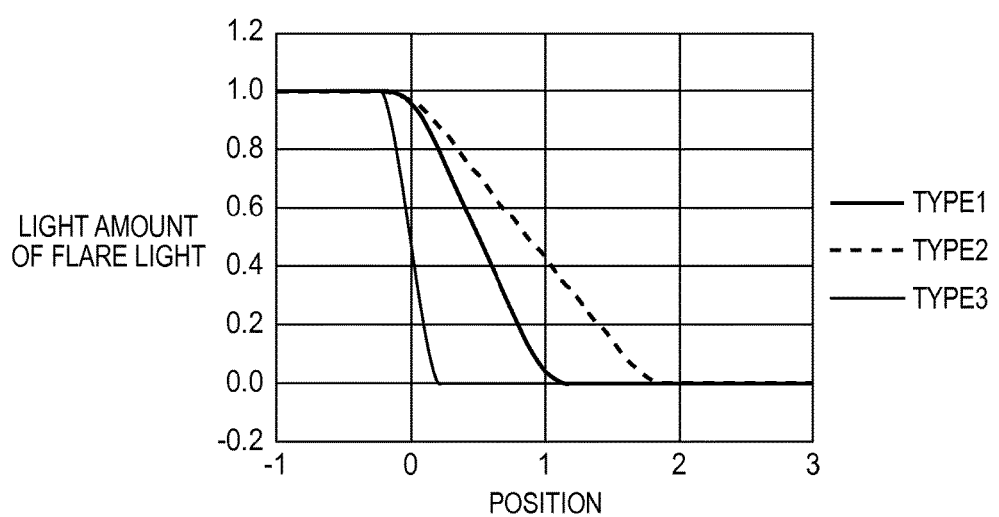
FIG. 10 is a view showing the influence of flare light on a substrate.

FIG. 10 is a view showing the influence of flare light on the substrate in each of type 1, type 2, and the type 3. In FIG. 10, a Y-axis direction position on the substrate (the normal exposure region is located on the negative side) is employed for the abscissa, and the light amount of flare light that has reaches the substrate 5 is employed for the ordinate. Note that the light amount of flare light that has reached the substrate 5 is normalized by defining the maximum value as 1.

Referring to FIG. 10, in type 3, the light amount abruptly changes in a shot region adjacent to the normal exposure region in the Y-axis direction. On the other hand, in type 1 and type 2, the light amount moderately decreases in the Y-axis direction as compared to type 3. In addition, the light amount more moderately decreases in type 2 in which the length L of the first openings 144a in the Y-axis direction is longer because the diameter EA of the light beam is large relative to the pitch of the first openings 144a in the X-axis direction.

In this embodiment, the aperture stop 14 is provided with the mask stage 3. However, the same effect as described above can be obtained even if the aperture stop 14 is provided with the substrate stage 6. In other words, the aperture stop 14 is provided with at least one of the mask stage 3 and the substrate stage 6. If providing the aperture stop 14 with the substrate stage 6, letting Z be the distance from the image plane of the projection optical system 4 to the aperture stop 14, NA be the numerical aperture on the image plane side of the projection optical system 4, and EA be the diameter of the light beam, which enters the aperture stop 14, on the aperture plane, they are set so as to meet equation (1) described above. The same effect can also be obtained even if the aperture stop 14 is provided with a holding member for holding a protective film that protects the pattern surface of the mask 2 where the pattern is formed.

The same effect can also be obtained even if not the aperture stop 14 but an optical member having a transmittance distribution to implement the same function as the second opening portion 144 (first openings 144a) is provided with at least one of the mask stage 3 and the substrate stage 6. In this case, the optical member includes a first portion corresponding to the shape of one shot region on the substrate, and a second portion that protrudes in the second direction parallel to the scanning direction from a side of the first portion along the first direction perpendicular to the scanning direction. In addition, the transmittance distribution of the second portion along the second direction is formed to decrease the transmittance as the distance from a side of the first portion along the first direction increases in the second direction.

The above-described transmittance distribution may be formed on a protective film (pellicle) that protects the pattern surface of the mask 2 where the pattern is formed. In this case, the protective film includes a first portion corresponding to the pattern surface of the mask 2, and a second portion that protrudes in the second direction parallel to the scanning direction from a side of the first portion along the first direction perpendicular to the scanning direction. In addition, the transmittance distribution of the second portion along the second direction is formed to decrease the transmittance as the distance from a side of the first portion along the first direction increases in the second direction. However, if forming the above-described transmittance distribution on the protective film, since the distance between the mask 2 and the protective film is short, and the diameter EA of the light beam on the protective film becomes small, a transmittance distribution according to this needs to be formed.

If making the normal exposure region 9 (shot region) wider or narrower and exposing the substrate 5, a variable portion that accordingly varies the size of the opening (particularly, first opening portion 142) of the aperture stop 14 is provided. This makes it possible to cope with the normal exposure region 9 of various sizes.

According to this embodiment, it is possible to reduce the influence of flare light that enters from the projection optical system 4 to the substrate 5 (particularly, reaches shot regions adjacent to the normal exposure region 9 in the scanning direction). Hence, the exposure apparatus 100 can sufficiently suppress deterioration of the imaging characteristic caused by flare light and provide a high-quality device (semiconductor device or liquid crystal display device) at a high throughput.

A method of manufacturing an article according to an embodiment of the present invention is suitable to manufacture an article, for example, a microdevice such as a semiconductor device or an element having a microstructure. The manufacturing method includes a step of exposing a substrate with a photoresist applied using the exposure apparatus 100, and a step of developing the exposed substrate. The manufacturing method can also include other known steps (oxidation, deposition, vapor deposition, doping, planarization, etching, resist removal, dicing, bonding, and packaging) next to the forming step. The method of manufacturing an article according to this embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-121850 filed on Jun. 12, 2014, which is hereby incorporated by reference herein in its entirety.

What is claimed is:

1. A scan-type exposure apparatus for transferring a pattern of a mask to a substrate via a projection optical system while scanning the mask and the substrate in a scanning direction, comprising:

an aperture stop provided with at least one of a mask stage that holds the mask and is movable and a substrate stage that holds the substrate and is movable and configured to reduce an influence of flare light that enters from the projection optical system to the substrate, wherein an opening of the aperture stop includes a first opening portion corresponding to one shot region on the substrate, and a serrated second opening portion including a plurality of first openings that protrude in a second direction parallel to the scanning direction from a side of the first opening portion along a first direction perpendicular to the scanning direction, and a length of each of the plurality of first openings in the first direction decreases outward in the second direction from the side of the first opening portion along the first direction.

2. The apparatus according to claim 1, wherein
the opening of the aperture stop includes a serrated third opening portion including a plurality of second openings that protrude in the first direction from a side of the first opening portion along the second direction, and
a length of each of the plurality of second openings in the second direction decreases outward in the first direction from the side of the first opening portion along the second direction.

3. The apparatus according to claim 1, wherein a pitch of the plurality of first openings in the first direction is smaller than a diameter of a light beam, which enters the aperture stop, on an aperture plane.

4. The apparatus according to claim 3, wherein
the aperture stop is provided with the mask stage, and
letting Z be a distance from an object plane of the projection optical system to the aperture stop, NA be a numerical aperture on the object plane side of the projection optical system, and EA be the diameter of the light beam, which enters the aperture stop, on the aperture plane, $$EA=NA \times Z \times 2$$

is met.

5. The apparatus according to claim 3, wherein
the aperture stop is provided with the substrate stage, and
letting Z be a distance from an image plane of the projection optical system to the aperture stop, NA be a numerical aperture on the image plane side of the projection optical system, and EA be the diameter of the light beam, which enters the aperture stop, on the aperture plane, $$EA=NA \times Z \times 2$$

is met.

6. The apparatus according to claim 1, further comprising a variable portion configured to vary a size of the opening of the aperture stop in accordance with the size of the shot region.

7. The apparatus according to claim 1, wherein the flare light enters, out of the shot regions on the substrate, a shot region adjacent in the second direction with respect to a target shot region to transfer the pattern.

8. A scan-type exposure apparatus for transferring a pattern of a mask to a substrate via a projection optical system while scanning the mask and the substrate in a scanning direction, comprising:
an aperture stop provided with a holding member holding that holds a protective film for protecting a pattern surface where the pattern of the mask is formed and configured to reduce an influence of flare light that enters from the projection optical system to the substrate,
wherein an opening of the aperture stop includes a first opening portion corresponding to the pattern surface, and a serrated second opening portion including a plurality of first openings that protrude in a second direction parallel to the scanning direction from a side of the first opening portion along a first direction perpendicular to the scanning direction, and
a length of each of the plurality of first openings in the first direction decreases outward in the second direction from the side along the first direction.

9. A method of manufacturing an article, the method comprising:
exposing a substrate using an exposure apparatus; and
developing the substrate which has been exposed,
wherein the exposure apparatus is a scan-type exposure apparatus for transferring a pattern of a mask to the substrate via a projection optical system while scanning the mask and the substrate in a scanning direction, and includes:
an aperture stop provided with at least one of a mask stage that holds the mask and is movable and a substrate stage that holds the substrate and is movable, and configured to reduce an influence of flare light that enters from the projection optical system to the substrate,
wherein an opening of the aperture stop includes a first opening portion corresponding to one shot region on the substrate, and a serrated second opening portion including a plurality of first openings that protrude in a second direction parallel to the scanning direction from a side of the first opening portion along a first direction perpendicular to the scanning direction, and
a length of each of the plurality of first openings in the first direction decreases outward in the second direction from the side of the first opening portion along the first direction.

10. A method of manufacturing an article, the method comprising:
exposing a substrate using an exposure apparatus; and
developing the substrate which has been exposed,
wherein the exposure apparatus is a scan-type exposure apparatus for transferring a pattern of a mask to the substrate via a projection optical system while scanning the mask and the substrate in a scanning direction, and includes:
an aperture stop provided with a holding member holding that holds a protective film for protecting a pattern surface where the pattern of the mask is formed and configured to reduce an influence of flare light that enters from the projection optical system to the substrate,
wherein an opening of the aperture stop includes a first opening portion corresponding to the pattern surface, and a serrated second opening portion including a plurality of first openings that protrude in a second direction parallel to the scanning direction from a side of the first opening portion along a first direction perpendicular to the scanning direction, and
a length of each of the plurality of first openings in the first direction decreases outward in the second direction from the side along the first direction.

* * * * *